US012429766B2

(12) United States Patent
Carlotti et al.

(10) Patent No.: US 12,429,766 B2
(45) Date of Patent: Sep. 30, 2025

(54) PHOTORESIST FORMULATIONS 3D MICROPRINTING TECHNIQUES

(71) Applicant: FONDAZIONE ISTITUTO ITALIANO DI TECNOLOGIA, Genoa (IT)

(72) Inventors: Marco Carlotti, Pisa (IT); Omar Tricinci, Pietracamela (IT); Virgilio Mattoli, Pisa (IT)

(73) Assignee: FONDAZIONE ISTITUTO ITALIANO DI TECNOLOGIA, Genoa (IT)

( * ) Notice: Subject to any disclaimer, the term of this patent is extended or adjusted under 35 U.S.C. 154(b) by 137 days.

(21) Appl. No.: 18/562,549

(22) PCT Filed: May 20, 2022

(86) PCT No.: PCT/IB2022/054718
§ 371 (c)(1),
(2) Date: Nov. 20, 2023

(87) PCT Pub. No.: WO2022/249002
PCT Pub. Date: Dec. 1, 2022

(65) Prior Publication Data
US 2024/0201585 A1    Jun. 20, 2024

(30) Foreign Application Priority Data
May 24, 2021    (IT) .................. 102021000013421

(51) Int. Cl.
*G03F 7/00*     (2006.01)
*B33Y 10/00*    (2015.01)
(Continued)

(52) U.S. Cl.
CPC ............ *G03F 7/0037* (2013.01); *B33Y 10/00* (2014.12); *B33Y 70/00* (2014.12); *B33Y 80/00* (2014.12);
(Continued)

(58) Field of Classification Search
CPC ........ B33Y 10/00; B33Y 70/00; G03F 7/0037
See application file for complete search history.

(56) References Cited

U.S. PATENT DOCUMENTS

| 2014/0030655 A1 | 1/2014 | Devoe |
| 2017/0031059 A1 | 2/2017 | Valeri et al. |
| 2018/0036940 A1 | 2/2018 | Fleischhaker et al. |

OTHER PUBLICATIONS

Deshayes S et al., "Polymeric biomaterials with engineered degradation", Journal of Polymer Science Part A: Polymer Chemistry, vol. 51, No. 17, Jun. 22, 2013, pp. 3531-3566.
(Continued)

*Primary Examiner* — James Sanders
(74) *Attorney, Agent, or Firm* — Silvia Salvadori, P.C.; Silvia Salvadori

(57) ABSTRACT

The present invention fits into the 3D microprinting sector and relates to a process for producing degradable 3D polymeric nano- or microstructures having sub-micrometre resolution. The process of the invention uses a photoresist formulation comprising a mixture of: (i) cyclic ketene acetal monomers; (ii) vinyl and/or (meth)acrylic monomers; and (iii) at least one photoinitiator. The process of the invention is based on two-photon polymerisation photoinitiated by focusing a laser beam within said photoresist formulation, with the obtainment of polymeric nano- or microstructures degradable under mild conditions and having sub-micrometre resolution.

19 Claims, 4 Drawing Sheets

(51) Int. Cl.
*B33Y 70/00* (2020.01)
*B33Y 80/00* (2015.01)
*G03F 7/031* (2006.01)

(52) U.S. Cl.
CPC .......... *G03F 7/031* (2013.01); *G03F 7/70025* (2013.01); *G03F 7/70375* (2013.01)

(56) References Cited

OTHER PUBLICATIONS

Search Report and Written Opinion of PCT/IB2022/054718 issued Sep. 19, 2022.

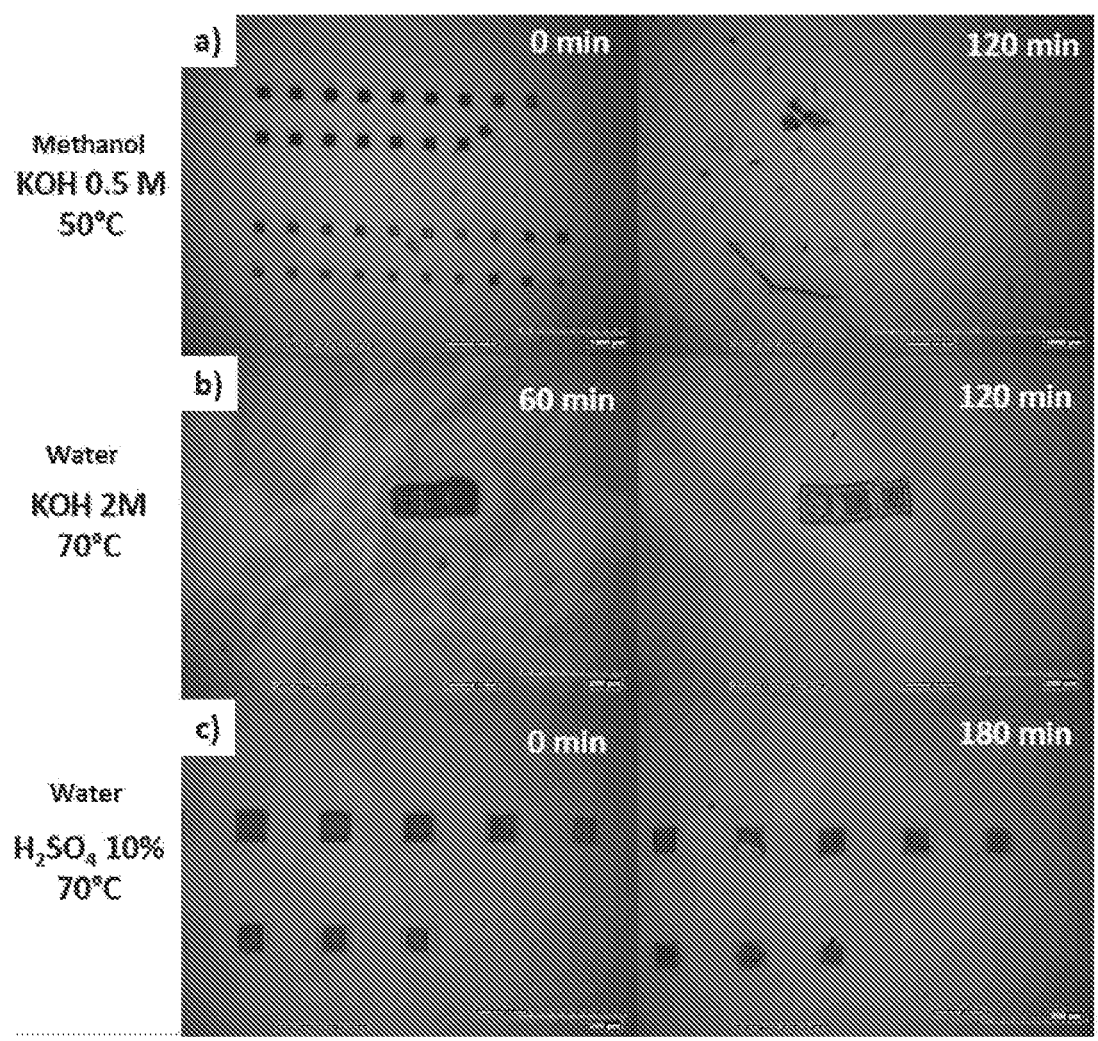

PHOTORESIST FORMULATIONS 3D MICROPRINTING TECHNIQUES

This application is U.S. national stage of PCT/IB2022/054718 filed on 20 May 2022 which claims priority to and the benefit of Italian patent application No. 102021000013421 filed on 24 May 2021, the content of which are all incorporated herein by reference in their entireties.

The project leading to this application has received funding from the European Union's Horizon 2020 research and innovation programme under the FET Open grant agreement 5DNanoPrinting—no. 899349

FIELD OF THE INVENTION

The present invention fits into the field of 3D microprinting and relates to the use of a photoresist formulation that enables degradable polymeric nano- or microstructures having sub-micrometre resolution to be obtained under mild conditions; said nano- or microstructures being formed via two-photon polymerisation reactions induced by laser beams focused within the photoresist.

STATE OF THE ART

Direct laser writing (DLW), also known as direct laser lithography, 3D laser lithography or 3D laser printing, is a micromanufacturing technique that employs laser pulses focused on a special light-sensitive resin (photoresist) suitable for initiating two-photon polymerisation reactions to produce, within the volume of the photoresist itself, 3D microstructures of many different shapes and complexities and with high sub-micrometre resolutions. More specifically, during the direct laser writing process, the laser beam is moved in all spatial directions through the photoresist, which polymerises (via a two-photon polymerisation reaction) only in the region near the most intense point of the focused laser beam. In this manner, little by little, complex microstructures can be constructed. This type of polymerisation is commonly obtained through a nonlinear optical process known as two-photon absorption, wherein two low-energy photons strike a molecule simultaneously, collectively providing sufficient energy to be absorbed. The probability of the two photons arriving simultaneously is extremely small at low intensities, but increases quadratically as the intensity increases. Therefore, the absorption, and thus the polymerisation, is localised, occurring only in the most intense region of a focused laser where the photon flux is high. This localised three-dimensional region where the printing takes place is known as a voxel, the element of volume named by analogy with the familiar element of 2D images, or pixel.

A typical photoresist used in DLW consists in a two-photon initiator and one or more monomers (such as, for example, epoxy and (meth)acrylic monomers), with a number of polymerisable final groups.

By positioning the photoresist on a piezo stage, which moves relative to the focal point of the laser, it is possible to construct arbitrary 3D microstructures deriving from the localised polymerisation of the photoresist, with up to sub-micron resolutions.

In a second phase, the remaining part of non-polymerised photoresist is selectively removed by means of a specific solvent. The remaining parts are complex polymeric architectures on a micro- or nanometric scale, and said structures are normally irreversibly cross-linked in a permanent and inalterable form.

However, at the current state of the art, there exists a significant number of applications that require the printing of degradable scaffolds that can thus be removed, adapted, modified, reconfigured or replaced on request in a step following the printing. Such an approach is often referred to as "subtractive manufacturing", to distinguish it from "additive manufacturing", i.e. traditional 3D printing. There is thus a need to provide photoresists which make it possible to obtain, by means of 3D microprinting techniques such as, for example, the direct laser printing technique, polymeric architectures that are not irreversible but, on the contrary, are easily degradable, modifiable and adaptable.

As reported by Grafe et al. "It's in the Fine Print: Erasable Three-Dimensional Laser-Printed Micro- and Nanostructures", Angew. Chem. Int. Ed. 2020, 59, 6330-6340, at the current state of the art there already exist photoresist formulations enabling degradable polymeric architectures to be obtained.

However, one disadvantage of the degradable microstructures obtained by DLW with the existing photoresist formulations is that they require high temperatures, solvents that are not in common use or other complex procedures for a complete degradation.

For example, in order to degrade photoresist structures polymerised by cross-linking of Diels-Alder adducts, processes that employ high temperatures are necessary. In the case of tetraalkylsilanes, by contrast, degradation takes place through the use of strong bases and fluorine, whilst in the case of disulphides it takes place through reduction processes. In the case of thiol-ene networks, degradation processes with nucleophiles are required; for o-nitrobenzyl-alcohol derivatives, it is instead necessary to use degradation processes with light, and for oligopeptides degradation processes by means of enzymes.

In the light of the foregoing, it appears clear that there remains a need in the art to provide a photoresist that makes it possible to obtain, by means of 3D microprinting processes via two-photon polymerisation (such as, for example, the direct laser writing technique), polymerised structures which are easily degradable under mild conditions.

The present invention solves the problems of the prior art by providing a photoresist formulation for 3D microprinting processes via two-photon polymerisation, preferably for direct laser writing processes or 3D micro-lithography, which makes it possible to obtain final nano- or polymerised microstructures that are not only biocompatible, but can also be degraded, modified, adapted and reconfigured under mild conditions. The present invention thus makes it possible to provide a 3D microprinting process via two-photon polymerisation which, thanks to the use of a suitable photoresist formulation resulting in the incorporation of aliphatic polyester units into the main chain of the polymer during the process, allows polymerised structures degradable under mild conditions to be obtained, thus resulting in a process that is characterised by freedom of design and flexibility and is adaptable to many different technological applications.

SUMMARY OF THE INVENTION

The present invention relates to a 3D microprinting process for producing degradable 3D polymeric nano- or microstructures having sub-micrometre resolution. The process of the invention uses a photoresist formulation comprising a mixture of:
(i) cyclic ketene acetal monomers of general formula (I), as described hereinbelow,
(ii) vinyl and/or (meth)acrylic monomers; and
(iii) at least one photoinitiator.

The mechanism enabling the aforesaid 3D polymeric nano- or microstructures to be obtained is based on a two-photon polymerisation process following the focusing of a laser beam within said photoresist formulation. This polymerisation is localised within the photoresist and enables the incorporation of aliphatic polyester units into the main chain of the polymer being formed during the process, thus making it possible to obtain polymerised structures that are degradable under mild conditions.

The present invention also relates to the aforesaid nano- and microstructures obtainable with the described process as well as the aforesaid photoresist formulation and the use thereof for producing 3D nano- or microstructures.

BRIEF DESCRIPTION OF THE FIGURES

FIG. 4 illustrates optical microscope images of the dissolution tests on the microstructures of the invention (frames a) and b)): dissolution test on pyramidal microstructures; frame c): dissolution test on microstructures having a "woodpile" structure).

DETAILED DESCRIPTION OF THE INVENTION

Figure 1:
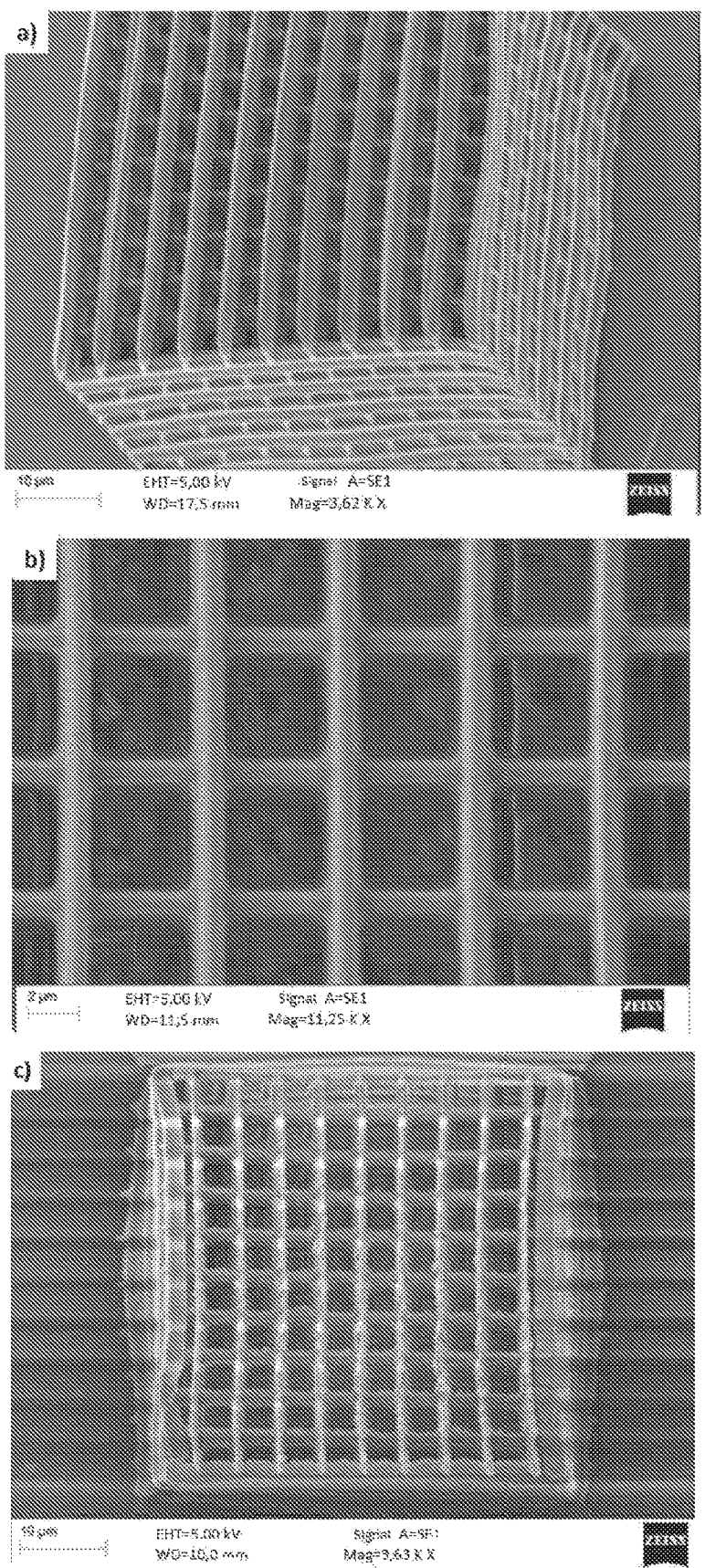
FIG. 1 shows scanning electron microscope (SEM) images of the microstructures having a "woodpile" structure, obtained as described in Example 1. The microstructure illustrated in frames a) and b) (the latter a magnification of frame a)) is obtained by means of the first liquid photoresist formulation of Example 1, whereas the microstructure shown in frame c) is obtained by means of the second liquid photoresist formulation of Example 1.

For the purposes of the present invention, the expression "sub-micrometre resolution" refers to printed structures or elements that have features and/or a lateral resolution of between 50 and 1000 nm.

Therefore, for the purposes of the present invention, the expression "3D polymeric nano- or microstructures having sub-micrometre resolution" is to be understood as "3D polymeric nano- or microstructures having a resolution of between 50 and 1000 nm, preferably between 500 and 1000 nm".

For the purposes of the present invention, the term "nanostructure" means a structure extending for less than 1000 nm in at least one of its dimensions.

For the purposes of the present invention, the term "microstructure" means a structure extending for less than 1000 micrometres in at least one of its dimensions.

For the purposes of the present invention, the expressions "polymerised nano- or microstructure" and "cross-linked nano- or microstructure" are to be understood as perfectly interchangeable synonyms indicating a final polymeric structure.

For the purposes of the present invention, the expression "di-/tri-/tetra-functional vinyl and/or (meth)acrylic monomers" means monomers having respectively 2/3/4 vinyl and/or (meth)acrylic functional groups, i.e. monomers that are capable of cross-linking with cyclic ketene acetal monomers according to the present invention.

The present invention relates to a 3D microprinting process via two-photon polymerisation for producing degradable 3D polymeric nano- or microstructures having sub-micrometre resolution.

Said 3D microprinting process via two-photon polymerisation is preferably a subtractive manufacturing process, more preferably a direct laser writing process or 3D microlithography.

The process according to the present invention comprises the steps of:
(a) providing a photoresist formulation comprising:
(i) cyclic ketene acetal monomers of general formula (I):

Formula (I)

selected from the group consisting of:
22-methylene-1,3-dioxane, 4-methyl-2-methylene-1,3-dioxane, 4,4,5,5-tetramethyl-2-methylene-1,3-dioxane, 2,4-dimethylene-1,3-dioxane, 2-methylene-hexhydrobenzo[d][1,3]dioxole, 2-methylene-1,3-dioxane, 4,6-dimethyl-2-methylene-1,3-dioxane, 5,5-dimethyl-2-methylene-1,3-dioxane, 2-methylene-4-phenyl-1,3-dioxane, 2-methylene-5,5-diphenyl-1,3-dioxane, 2-methylene-1,3-dioxepane (MDO), 4,7-dimethyl-2-methylene-1,3-dioxepane, 3-methylene-1,5-dihydrobenzo[e][1,3]dioxepine, 4-methylene-3,5-dioxabicyclo[5.1.0]octane, 2-(difluoromethylene)-1,3-dioxepane, 5,6-dimethoxy-2-methylene-1,3-dioxepane, 2-methylene-1,3-dithiepane, 3,9-dimethylene-1,5,8,10-tetraoxaspiro[5.5]undecane, and a combination thereof;
(ii) vinyl and/or (meth)acrylic monomers selected from the group consisting of: pentaerythritol tetraacrylate, pentaerythritol triacrylate, 1,4-butanediol diacrylate, 1,3-butanediol diacrylate, 1,6-hexanediol diacrylate, neopentyl glycol diacrylate, bisphenol A diacrylate, tricyclo[5.2.1.0$^{2,6}$]decanedimethanol diacrylate, trimethylolpropane triacrylate, ethyl acrylate, ethylene-methyl acrylate, methyl methacrylate, 2-chloroethyl vinyl ether, 2-hydroxyethyl acrylate, hydroxyethyl methacrylate, butyl acrylate, 1,3-butadiene, isoprene, 2,3-dimethyl-1,3-butadiene, chloroprene, styrene, and a combination thereof;
(iii) at least one photoinitiator;
(b) focusing a laser beam within said photoresist formulation by directing said laser beam until localised polymerisation of said photoresist into a 3D cross-linked polymeric nano- or microstructure is achieved;

(c) removing the non-cross-linked portion of photoresist by washing with a solvent.

According to one embodiment of the invention, the aforesaid photoresist formulation of step (a) is an initially liquid formulation, which, following step (b) of focusing a laser beam according to the present invention, is locally polymerised (i.e. hardened, solidified, cross-linked).

According to an alternative embodiment of the invention, the aforesaid photoresist formulation of step (a) is an initially solid formulation, which, following step (b) of focusing a laser beam according to the present invention, is locally polymerised (i.e. cross-linked).

The aforesaid cyclic ketene acetal monomers (i) have the following chemical formulas (shown in the order in which they have been named):

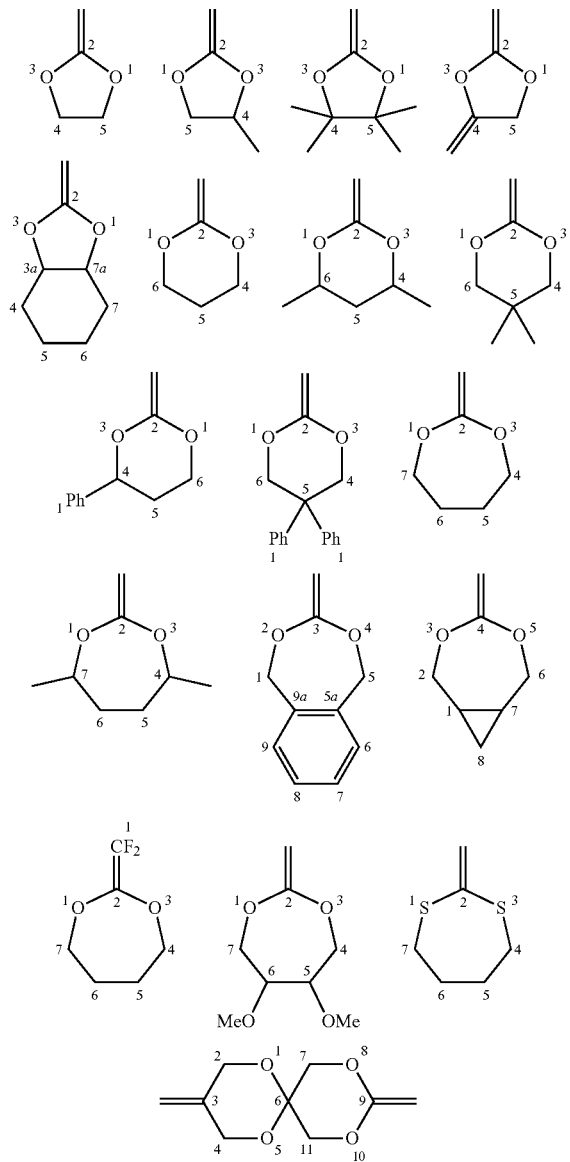

The cyclic ketene acetal monomers (i) are preferably selected from: 2-methylene-1,3-dioxepane (MDO), 4,7-dimethyl-2-methylene-1,3-dioxepane, 2-(difluoromethylene)-1,3-dioxepane, 5,6-dimethoxy-2-methylene-1,3-dioxepane, 2-methylene-1,3-dithiepane, and a combination thereof, that is, cyclic ketene acetal monomers with seven-membered cycles.

Without wishing to be bound to a specific theory, the Applicant has found that the aforesaid cyclic ketene acetal monomers (i) with seven-membered cycles, are preferred for the purposes of the present invention for reasons of greater stability.

According to a preferred embodiment, the cyclic ketene acetal monomers (i) are monomers of 2-methylene-1,3-dioxepane (MDO).

According to one embodiment of the invention, said photoresist formulation of step (a) comprises said cyclic ketene acetal monomers (i) in a concentration of between 20 and 90 wt % relative to the total weight of the formulation.

For the purposes of the present invention, said concentration "of between 20 and 90 wt %" means that said cyclic ketene acetal monomers (i) can be present within the photoresist formulation of step (a) in a concentration equal to any value between the two aforesaid extremes, such as, for example, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 81%, 83%, 94%, 95%, 96%, 87%, 88%, 89% or 90%.

The concentration of said cyclic ketene acetal monomers (i) is preferably between 20 and 80 wt %, more preferably between 25 and 75 wt %, even more preferably between 45 and 55 wt % relative to the total weight of the formulation, in the case wherein the composition comprises tri-functional vinyl and/or (meth)acrylic monomers (ii).

The concentration of said cyclic ketene acetal monomers (i) is preferably between 65 and 95 wt %, more preferably between 70 and 90 wt %, even more preferably between 80 and 90 wt % relative to the total weight of the formulation, in the case wherein the composition comprises tetra-functional vinyl and/or (meth)acrylic monomers (ii).

The vinyl and/or (meth)acrylic monomers (ii) are preferably selected from the group consisting of: pentaerythritol tetraacrylate, pentaerythritol triacrylate, 1,4-butanediol diacrylate, 1,3-butanediol diacrylate, 1,6-hexanediol diacrylate and a combination thereof.

According to one embodiment of the invention, said photoresist formulation of step (a) comprises said vinyl and/or (meth)acrylic monomers (ii) in a concentration of between 5 and 50 wt % relative to the total weight of the formulation.

For the purposes of the present invention, said concentration "of between 5 and 50 wt %" means that said vinyl and/or (meth)acrylic monomers (ii) can be present within the photoresist formulation of step (a) in a concentration equal to any value between the two aforesaid extremes, such as, for example, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49% or 50%.

In the case of tri-functional vinyl and/or (meth)acrylic monomers (ii), the concentration of said monomers (ii) is preferably between 25 and 50 wt %, more preferably between 30 and 50 wt %, even more preferably equal to about 50 wt % relative to the total weight of the formulation.

In the case of tetra-functional vinyl and/or (meth)acrylic monomers (ii), the concentration of said monomers is preferably between 5 and 25 wt %, more preferably between 10 and 15 wt %, even more preferably equal to about 10 wt % relative to the total weight of the formulation.

According to one embodiment of the present invention, said at least one photoinitiator (iii) is selected from the group consisting of: 2-dimethylamino-2-(4-methyl-benzyl)-1-(4-morpholin-4-yl-phenyl)-butan-1-one, 2-Benzyl-2-(dimethylamino)-4'-morpholinobutyrophenone, 2-Methyl-4'-(methylthio)-2-morpholinopropiophenone, 1-Hydroxy-cyclohexyl-phenylketone, 2-Hydroxy-2-methylpropiophenone, 2,2-Dimethoxy-2-phenylacetophenone, lithium phenyl-2,4,6-trimethylbenzoylphospinate, and a combination thereof.

More preferably, said at least one photoinitiator is 2-dimethylamino-2-(4-methyl-benzyl)-1-(4-morpholin-4-yl-phenyl)-butan-1-one.

According to one embodiment of the invention, said photoresist formulation of step (a) comprises said at least one photoinitiator (iii) in a concentration of between 1 and 15 wt % relative to the total weight of the formulation.

For the purposes of the present invention, said concentration "of between 1 and 15 wt %" means that said at least one photoinitiator can be present within the photoresist formulation of step (a) in a concentration equal to any value between the two aforesaid extremes, such as, for example, 1%, 2%, 3%, 4%, 5%, 6%, 7%, 8%, 9%, 10%, 11%, 12%, 13%, 14% or 15%.

Said concentration is preferably between 1 and 10 wt %, more preferably between 3 and 8 wt %, even more preferably between 3 and 5 wt % relative to the total weight of the formulation.

According to one embodiment, said photoresist formulation of step (a) essentially consists of the components (i)-(iii) as described above.

According to a further embodiment, said photoresist formulation of step (a) consists of the components (i)-(iii) as described above.

According to one embodiment, said solvent of step (c) of the process according to the present invention is selected from the group consisting of: isopropyl alcohol, chloroform, dichloromethane, hexane, propylene glycol methyl ether acetate and a combination thereof.

For the purposes of the present invention, said step (c) is to be understood as a step of the process in which the "development" of the nano- or microstructure takes place by removal of the unreacted (i.e. non-cross-linked) part of the photoresist.

Without wishing to be bound to a specific theory, the Applicant has found that the process according to the present invention enables degradable nano- and microstructures to be obtained in a controllable manner under mild conditions.

For the purposes of the present invention, said degradable nano- and microstructures obtained in a controlled manner under mild conditions are also defined as "biodegradable nano- and microstructures".

In other words, the polymeric nano- and microstructures obtainable with the process according to the present invention can advantageously be removed, adapted, modified, reconfigured and/or replaced on request in a step following printing under mild conditions, i.e. by means of treatments:
in 0.25-5 M KOH solutions in methanol at a temperature between 35 and 80° C., preferably between 40 and 70° C., more preferably between 45 and 55° C., even more preferably at a temperature of about 50° C., or
in basic aqueous solutions with a pH≥14 at a temperature between 50 and 100° C., preferably between 60 and 90° C., more preferably between 75 and 85° C., even more preferably at a temperature of about 70° C., or else
in aqueous solutions of sulphuric acid with a pH≤1 at a temperature between 50 and 100° C., preferably between 60 and 90° C., more preferably between 75 and 85° C., even more preferably at a temperature of about 70° C.

Without wishing to be bound to a specific theory, it is nonetheless possible to maintain that such degradability is obtainable under the aforesaid conditions precisely thanks to the use, within the photoresist formulation, of the specific cyclic ketene acetal monomers (i) as described above. The use of such monomers ensures that, during the two-photon polymerisation of the photoresist ("radical ring opening polymerisation" of the cyclic ketene acetal monomers (i) and vinyl and/or (meth)acrylic monomers (ii)—indicated as R in Diagram 1 shown below—which is photoinduced by the laser beam focused within the photoresist itself), an incorporation of aliphatic polyester units into the main chain of the polymer being formed will take place (see Diagram 1 shown below), thus resulting in a process characterised by freedom of design and flexibility and adaptable to many different technological applications.

Diagram 1: Example of Radical Ring Opening Polymerisation (RROP) of 2-methylene-1,3-dioxepane, which Results in the Formation of an Aliphatic Polyester (Polycaprolactone)

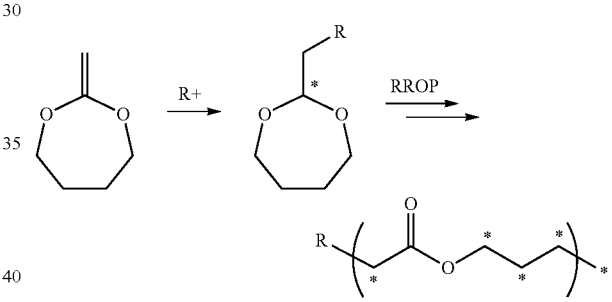

The Applicant has moreover found that, advantageously, the incorporation of the aforesaid aliphatic polyester units improves the mechanical stiffness of the polymeric nano- and microstructures obtained and does not give rise to phenomena of laser defocusing due to refractive-index mismatch, thus enabling the manufacture of nano- and microstructures with architectures of arbitrary complexity and which are characterised by high height/thickness ratios, but at the same time maintain good mechanical properties and stability.

The aforesaid polyester units also ensure that the degradability of the nano- and microstructures is controllable according to the conditions used and can be achieved on demand according to need.

According to one embodiment, the process according to the present invention envisages that said photoresist formulation of step (a) further comprises:
(iv) at least one solvent which does not interact with the other components (i)-(iii) of the formulation, said solvent also being referred to as an "inert solvent" for the purposes of the present invention.

Said at least one solvent (iv) is preferably selected from the group consisting of: cyrene, dimethylformamide, dimethylsulfoxide, pentadecane, hexadecane, heptadecane, octadecane, and a combination thereof.

Said photoresist formulation of step (a) preferably comprises said at least one solvent (iv) in a concentration of between 1 and 30 wt % relative to the total weight of the formulation.

For the purposes of the present invention, said concentration "of between 1 and 30 wt %" means that said at least one solvent (iv) can be present within the photoresist formulation of step (a) in a concentration equal to any value between the two aforesaid extremes, such as, for example, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29% or 30%.

Said concentration is preferably between 4 and 25 wt %, preferably between 5 and 20 wt %, more preferably between 10 and 25%, even more preferably between 15 and 25 wt % relative to the total weight of the formulation.

According to one embodiment, said photoresist formulation of step (a) essentially consists of the components (i)-(iv) described above.

According to another embodiment, said photoresist formulation of step (a) consists of the components (i)-(iv) described above.

Without wishing to be bound to a specific theory, it is nonetheless possible to observe that said further solvent (iv) may be advantageously added to the photoresist formulation of step (a) in the process according to the present invention for the purpose of adjusting the viscosity of said formulation and/or enabling a reduction in the amount of the more costly components within the formulation, while in any case enabling a formulation with satisfactory properties and performances to be obtained which make it suitable for use in 3D microprinting processes via two-photon polymerisation for producing degradable 3D polymeric nano- or microstructures having sub-micrometre resolution according to the present invention.

According to one embodiment, said laser of step (b) of the process according to the present invention is a laser characterised by having a wavelength of between 650 and 900 nm, preferably between 770 and 800 nm.

The subject matter of the present invention further relates to a polymeric nano- or microstructure 3D obtainable with the process as described above.

The nano- or microstructure according to the present invention possesses a sub-micrometre resolution and is characterised by being completely degradable under at least one of the following conditions:
  within 3 hours at a temperature of between 35 and 80° C., preferably between 40 and 70° C., more preferably between 45 and 55° C., even more preferably of about 50° C., in 0.25-5 M KOH solutions in methanol;
  within 3 hours at a temperature of between 50 and 100° C., preferably between 60 and 90° C., more preferably between 75 and 85° C., even more preferably of about 70° C., in basic aqueous solutions with a pH≥12, preferably ≥13, more preferably ≥14, or
  within 9 hours at a temperature of between 50 and 100° C., preferably between 60 and 90° C., more preferably between 75 and 85° C., even more preferably of about 70° C., in sulphuric acid solutions with a pH≤1.

Said nano- or microstructure is preferably characterised by having a height between 10 and 200 μm.

As already mentioned, without wishing to be bound to a specific theory, it is nonetheless possible to observe that the polymeric nano- and microstructures obtainable with the process according to the present invention are characterised not only by a sub-micrometre resolution and a degradability that is controllable under mild conditions, preferably a controllable degradability, but also in that said nano- or microstructure can be produced in shapes and structures of arbitrary complexity having a relatively great height and can be characterised by good mechanical properties and stability as well.

The subject matter of the present invention also relates to a photoresist formulation according to any one of the embodiments as described above.

Said formulation comprises:
(i) cyclic ketene acetal monomers of general formula (I):

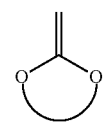

Formula (I)

selected from the group consisting of:
  2-methylene-1,3-dioxane, 4-methyl-2-methylene-1,3-dioxane, 4,4,5,5-tetramethyl-2-methylene-1,3-dioxane, 2,4-dimethylene-1,3-dioxane, 2-methylene-hexhydrobenzo[d][1,3]dioxole, 2-methylene-1,3-dioxane, 4,6-dimethyl-2-methylene-1,3-dioxane, 5,5-dimethyl-2-methylene-1,3-dioxane, 2-methylene-4-phenyl-1,3-dioxane, 2-methylene-5,5-diphenyl-1,3-dioxane, 2-methylene-1,3-dioxepane (MDO), 4,7-dimethyl-2-methylene-1,3-dioxepane, 3-methylene-1,5-dihydrobenzo[e][1,3]dioxepine, 4-methylene-3,5-dioxabicyclo[5.1.0]octane, 2-(difluoromethylene)-1,3-dioxepane, 5,6-dimethoxy-2-methylene-1,3-dioxepane, 2-methylene-1,3-dithiepane, 3,9-dimethylene-1,5,8,10-tetraoxaspiro[5.5]undecane, and a combination thereof;
(ii) vinyl and/or (meth)acrylic monomers selected from the group consisting of: pentaerythritol tetraacrylate, pentaerythritol triacrylate, 1,4-butanediol diacrylate, 1,3-butanediol diacrylate, 1,6-hexanediol diacrylate, neopentyl glycol diacrylate, bisphenol A diacrylate, tricyclo[5.2.1.0$^{2.6}$]decanedimethanol diacrylate, trimethylolpropane triacrylate, ethyl acrylate, ethylene-methyl acrylate, methyl methacrylate, 2-chloroethyl vinyl ether, 2-hydroxyethyl acrylate, hydroxyethyl methacrylate, butyl acrylate, 1,3-butadiene, isoprene, 2,3-dimethyl-1,3-butadiene, chloroprene, styrene, and a combination thereof;
(iii) at least one photoinitiator, Said at least one photoinitiator (iii) is preferably selected from the group consisting of: 2-dimethylamino-2-(4-methylbenzyl)-1-(4-morpholin-4-yl-phenyl)-butan-1-one, 2-Benzyl-2-(dimethylamino)-4'-morpholinobutyrophenone, 2-Methyl-4'-(methylthio)-2-morpholinopropiophenone, 1-Hydroxy-cyclohexyl-phenylketone, 2-Hydroxy-2-methylpropiophenone, 2,2-Dimethoxy-2-phenylacetophenone, lithium phenyl-2,4,6-trimethylbenzoylphospinate, and a combination thereof.

Said photoresist formulation preferably further comprises:
  (iv) at least one solvent which does not interact with the other components (i)-(iii) of the formulation, said solvent being selected from the group consisting of: cyrene, dimethylformamide, dimethylsulfoxide, pentadecane, hexadecane, heptadecane, octadecane, and a combination thereof.

Said photoresist formulation preferably comprises said cyclic ketene acetal monomers (i) in a concentration of between 20 and 90 wt % relative to the total weight of the formulation.

Said photoresist formulation preferably comprises said vinyl and/or (meth)acrylic monomers (ii) in a concentration of between 5 and 50 wt % relative to the total weight of the formulation.

Said photoresist formulation preferably comprises said at least one photoinitiator (iii) in a concentration of between 1 and 15 wt %, preferably in a concentration of 3 to 5 wt % relative to the total weight of the formulation.

Said photoresist formulation preferably comprises said at least one solvent (iv) in a concentration of between 1 and 30 wt %, preferably between 4 and 25 wt % relative to the total weight of the formulation.

The subject matter of the present invention further relates to the use of a photoresist formulation according to any one of the previously described embodiments, for producing degradable 3D polymeric nano- or microstructures having sub-micrometre resolution by means of a 3D microprinting process via two-photon polymerisation.

Said 3D microprinting process via two-photon polymerisation is preferably as previously described. More preferably, said process is a subtractive manufacturing process, even more preferably a direct laser writing process or 3D micro-lithography.

The subject matter of the present invention further relates to a method for using a photoresist formulation according to any one of the previously described embodiments, for producing degradable 3D polymeric nano- or microstructures having sub-micrometre resolution by means of a 3D microprinting process via two-photon polymerisation. Said 3D microprinting process via two-photon polymerisation is preferably as previously described. More preferably said process is a subtractive manufacturing process, even more preferably a direct laser writing process or 3D micro-lithography.

EXAMPLES

Example 1—Preparation of Liquid Photoresist Formulations for Direct Laser Writing (DLW)

A series of polymeric microstructures was prepared by means of the liquid photoresist formulations and the process as previously described according to the present invention. The instrumentation used is commercial instrumentation for DLW (Nanoscribe Gmbh.).

A first liquid photoresist formulation was prepared by mixing 2-methylene-1,3-dioxepane (MDO, 90 wt %), pentaerythritol tetraacrylate (10 wt %) and 2-dimethylamino-2-(4-methyl-benzyl)-1-(4-morpholin-4-yl-phenyl)-butan-1-one (as the photoinitiator, 5 wt %). Printing of the microstructures was subsequently carried out using an oil-immersion objective (63×). A dose of 5 mJ/mm proved to be sufficient to start polymerisation and produce microstructures with sub-micrometre resolutions and capable of bearing their own weight.

The microstructures thus obtained are shown in FIG. 1 (frames a) and b)), wherein frame b) is a magnification of the SEM image illustrated in frame a).

In addition to these microstructures (having a "woodpile" structure), it was possible to use the same formulation and the same printing parameters to prepare more complex structures, thus demonstrating the extreme versatility of the formulation and process according to the present invention.

Figure 2:
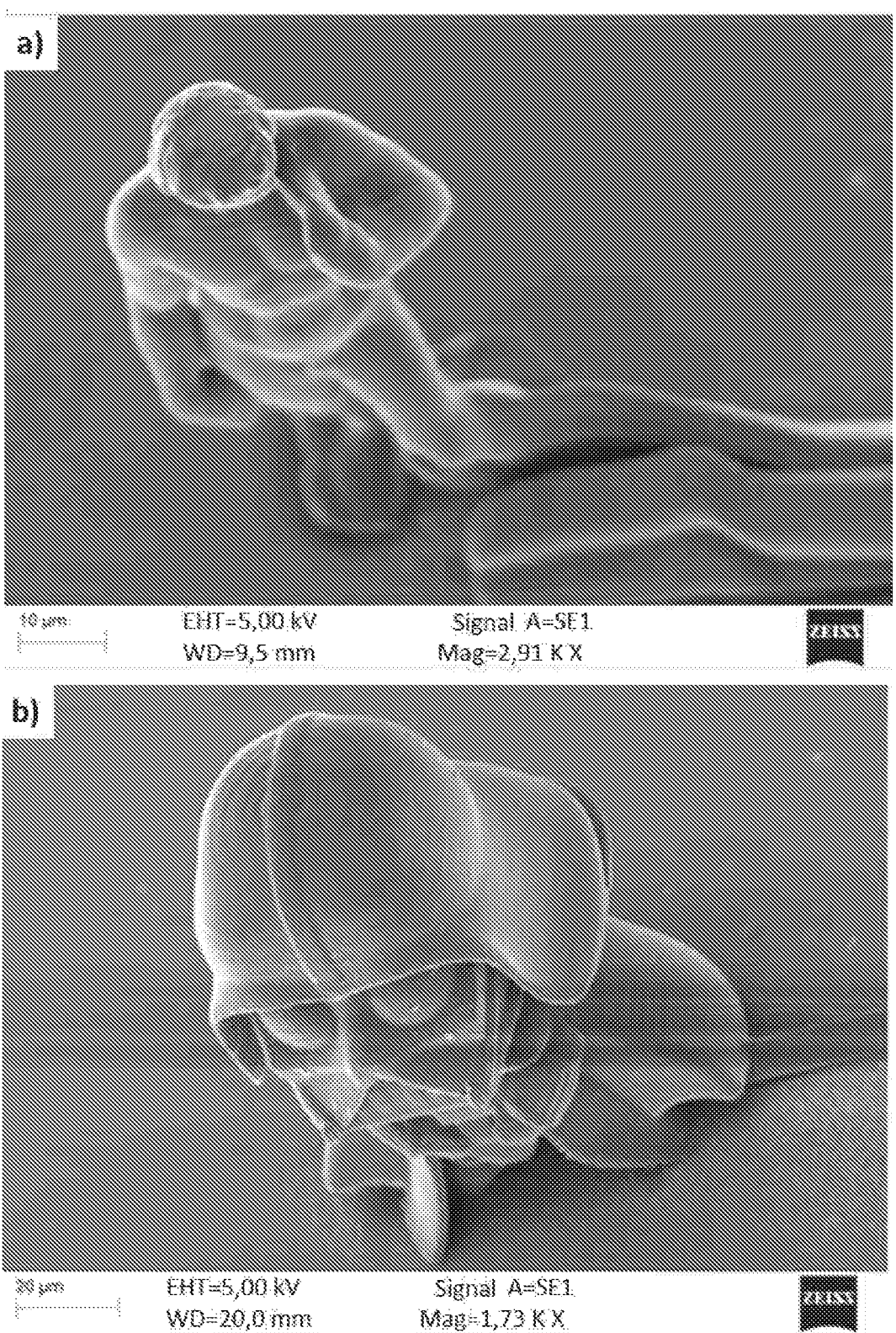
FIG. 2 shows scanning electron microscope (SEM) images of microstructures having complex structures; frame a): a reproduction of Michelangelo's statue of David having a height of about 180 µm; frame b): a reproduction of the "Darth Vader" character of the Stars Wars movies having a height of about 80 µm), obtained as described in Example 1.
Figure 3:
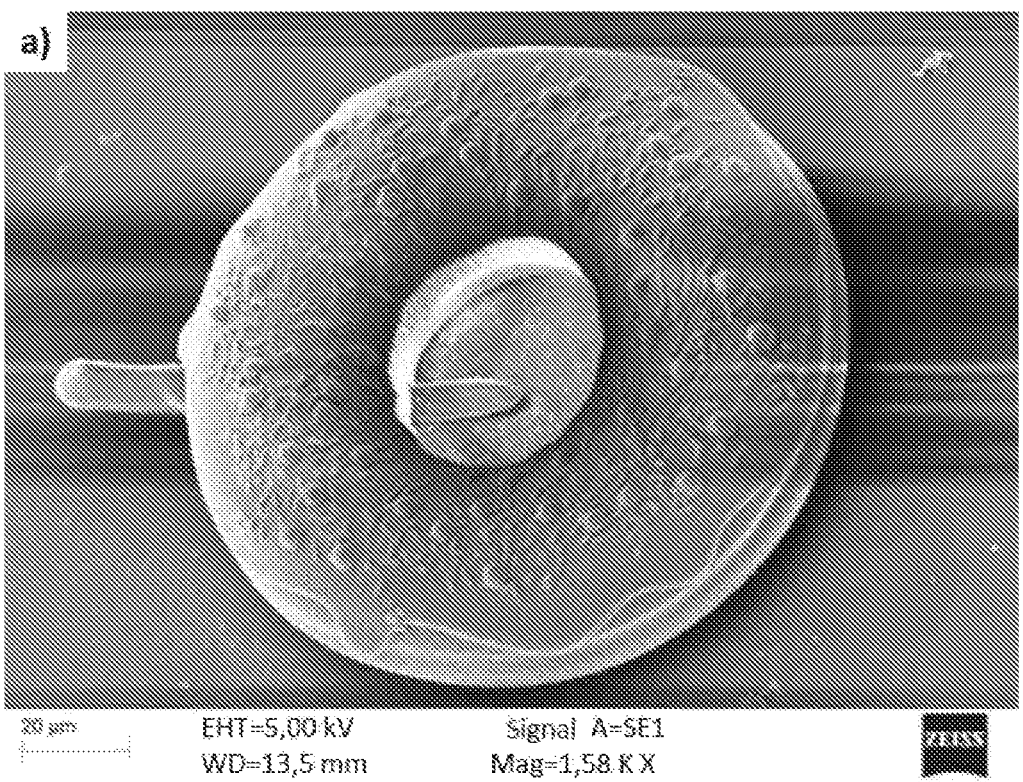
FIG. 3 shows scanning electron microscope (SEM) images of further microstructures having complex structures; frame a): a doughnut cut through with a knife; frame b): a pyramidal structure obtained as described in Example 1.
Figure 3:
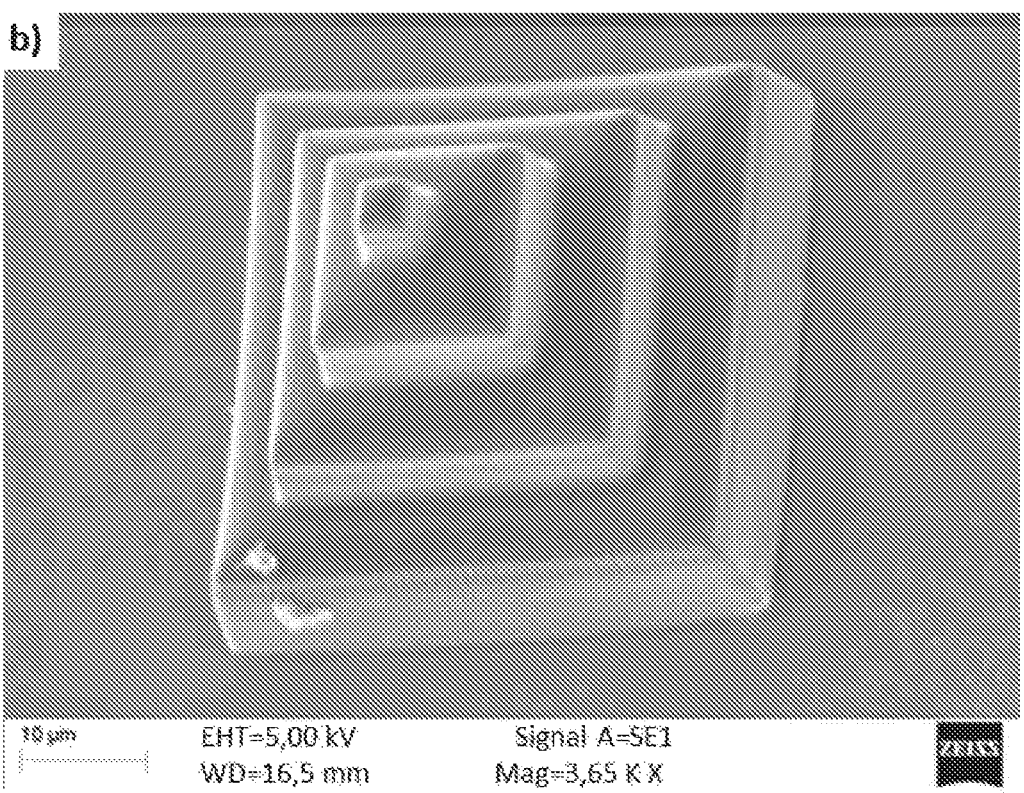

These complex microstructures are shown in frames a)-b) of FIGS. 2 and 3.

A second liquid photoresist formulation was prepared by repeating the formulation of the first formulation described above, but further adding an inert solvent (cyrene, 25 wt %).

The microstructure obtained with this formulation is shown in frame c) of FIG. 1 and demonstrates how the addition of an inert solvent up to 25 wt % does not drastically influence either the printing process or the properties of the resulting structure.

Example 2—Degradation Test on the Microstructures Produced by DLW

The capacity of degradation and selective removal of the microstructures obtained with the photoresist formulations according to the present invention was investigated by observing the rate of dissolution of the aforesaid microstructures (both "solid" ones, like the ones illustrated in FIG. 2 or 3, and the ones with a "woodpile" structure shown in FIG. 1) using the following solutions (50 mL) and conditions:

potassium hydroxide KOH in methanol (with concentrations of between 0.5 and 5 M) at 50° C.;
potassium hydroxide KOH 2M in water at 70° C.;
sulphuric acid 10% vol. in water at 70° C.

The effectiveness of the above-described treatments was evaluated by observing the test samples under an optical microscope (Hirox Digital Optical Microscope KH-7700) after they had been immersed in methanol and isopropanol.

As may be observed from the images shown in FIG. 4, the microstructures obtained with the process of the present invention prove to be degradable with the above-described treatments. More specifically, the pyramidal structures in frame b) of FIG. 2 prove to be completely degradable after 120 minutes of treatment with 50 ml of potassium hydroxide KOH in a methanol solution (concentration 0.5 M) at 50° C.(see frame a), FIG. 4). With 120 minutes of treatment with a solution of potassium hydroxide KOH 2M in water at 70° C., the aforesaid pyramidal structures, even if visible, nonetheless show to have an acceptable degree of degradation (frame b), FIG. 4).

The same applies in the case of the "woodpile" structures in FIG. 1 when subjected to 180 minutes of treatment with a solution of sulphuric acid 10% vol. in water at 70° C.

The invention claimed is:

1. 3D micro-printing process via two-photon polymerisation for producing degradable 3D polymeric nano- or microstructures having sub-micrometre resolution, said process comprising the steps of:
(a) providing a photoresist formulation comprising:
(i) Cyclic ketene acetal monomers of general formula (I):

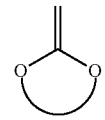

Formula (I)

selected from the group consisting of:
2-methylene-1,3-dioxane, 4-methyl-2-methylene-1,3-dioxane, 4,4,5,5-tetramethyl-2-methylene-1,3-dioxane, 2,4-dimethylene-1,3-dioxane, 2-methylene-hexhydrobenzo[d][1,3]dioxole, 2-methylene-1,3-dioxane, 4,6-dimethyl-2-methylene-1,3-dioxane, 5,5-dimethyl-2-methylene-1,3-dioxane, 2-methylene-4-phenyl-1,3- dioxane, 2-methylene-5,5-diphenyl-1,3-dioxane, 2-methylene-1,3-dioxepane (MDO), 4,7-dimethyl-2-methylene-1,3-dioxepane, 3-methylene-1,5-dihydrobenzo[e][1,3]dioxepine, 4-methylene-3,5-dioxabicyclo[5.1.0]octane, 2-(difluoromethylene)-1,3-dioxepane, 5,6-dimethoxy-2-methylene-1,3-dioxepane, 2-methylene-1,3-dithiepane, 3,9-dimethylene-1,5,8,10-tetraoxaspiro[5.5]undecane, and a combination thereof;
(ii) vinyl and/or (meth)acrylic monomers selected from the group consisting of: pentaerythritol tetraacrylate, pentaerythritol triacrylate, 1,4-butanediol diacrylate, 1,3-butanediol diacrylate, 1,6-hexanediol diacrylate, neopentyl glycol diacrylate, bisphenol A diacrylate, tricyclo[5.2.1.0$^{2,6}$]decanedimethanol diacrylate, trimethylolpropane triacrylate, ethyl acrylate, ethylene-methyl acrylate, methyl methacrylate, 2-chloroethyl vinyl ether, 2-hydroxyethyl acrylate, hydroxyethyl methacrylate, butyl acrylate, 1,3-butadiene, isoprene, 2,3-dimethyl-1,3-butadiene, chloroprene, styrene, and a combination thereof;
(iii) at least one photoinitiator;
(b) focusing a laser beam within said photoresist formulation by directing said laser beam until localised polymerisation of said photoresist into a 3D cross-linked polymeric nano- or microstructure is achieved;
(c) removing the non-cross-linked portion of photoresist by washing with a solvent.

2. Process according to claim 1, wherein said process is a subtractive manufacturing process.

3. Process according to claim 1, wherein said at least one photoinitiator (iii) is selected from the group consisting of: 2-dimethylamino-2-(4-methyl-benzyl)-1-(4-morpholin-4-yl-phenyl)-butan-1-one, 2-Benzyl-2-(dimethylamino)-4'-morpholinobutyrophenone, 2-Methyl-4'-(methylthio)-2-morpholinopropiophenone, 1-Hydroxy-cyclohexyl-phenylketone, 2-Hydroxy-2-methylpropiophenone, 2,2-Dimethoxy-2-phenylacetophenone, lithium phenyl-2,4,6-trimethylbenzoylphospinate, and a combination thereof.

4. Process according to claim 1, wherein said solvent of step (c) is selected from the group consisting of: isopropyl alcohol, chloroform, dichloromethane, hexane, propylene glycol methyl ether acetate and a combination thereof.

5. Process according to claim 1, wherein said photoresist formulation further comprises:
(iv) at least one solvent which does not interact with the other components (i)-(iii) of the formulation, this solvent being selected from the group consisting of: cyrene, dimethylformamide, dimethylsulfoxide, pentadecane, hexadecane, heptadecane, octadecane, and a combination thereof.

6. Process according to claim 1, wherein said photoresist formulation comprises said cyclic ketene acetal monomers (i) in a concentration of between 20 and 90 wt % relative to the total weight of the formulation.

7. Process according to claim 1, wherein said photoresist formulation comprises said vinyl and/or (meth)acrylic monomers (ii) in a concentration of from 5 to 50 wt % relative to the total weight of the formulation.

8. Process according to claim 1, wherein said photoresist formulation comprises said at least one photoinitiator (iii) in a concentration of between 1 and 15 wt % relative to the total weight of the formulation.

9. Process according to claim 5, wherein said photoresist formulation comprises said at least one solvent (iv) in a concentration of between 1 and 30% by weight relative to the total weight of the formulation.

10. Photoresist formulation comprising:
(i) cyclic ketene acetal monomers of general formula (I):

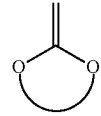

Formula (I)

selected from the group consisting of:
2-methylene-1,3-dioxane, 4-methyl-2-methylene-1,3-dioxane, 4,4,5,5-tetramethyl-2-methylene-1,3-dioxane, 2,4-dimethylene-1,3-dioxane, 2-methylene-hexhydrobenzo[d][1,3]dioxole, 2-methylene-1,3-dioxane, 4,6-dimethyl-2-methylene-1,3-dioxane, 5,5-dimethyl-2-methylene-1,3-dioxane, 2-methylene-4-phenyl-1,3-dioxane, 2-methylene-5,5-diphenyl-1,3-dioxane, 2-methylene-1,3-dioxepane (MDO), 4,7-dimethyl-2-methylene-1,3-dioxepane, 3-methylene-1,5-dihydrobenzo[e][1,3]dioxepine, 4-methylene-3,5-dioxabicyclo[5.1.0]octane, 2-(difluoromethylene)-1,3-dioxepane, 5,6-dimethoxy-2-methylene-1,3-dioxepane, 2-methylene-1,3-dithiepane, 3,9-dimethylene-1,5,8,10-tetraoxaspiro[5.5]undecane, and a combination thereof;
(ii) vinyl and/or (meth)acrylic monomers selected from the group consisting of: pentaerythritol tetraacrylate, pentaerythritol triacrylate, 1,4-butanediol diacrylate, 1,3-butanediol diacrylate, 1,6-hexanediol diacrylate, neopentyl glycol diacrylate, bisphenol A diacrylate, tricyclo[5.2.1.0$^{2,6}$]decanedimethanol diacrylate, trimethylolpropane triacrylate, ethyl acrylate, ethylene-methyl acrylate, methyl methacrylate, 2-chloroethyl vinyl ether, 2-hydroxyethyl acrylate, hydroxyethyl methacrylate, butyl acrylate, 1,3-butadiene, isoprene, 2,3-dimethyl-1,3-butadiene, chloroprene, styrene, and a combination thereof;
(iii) at least one photoinitiator.

11. Photoresist formulation according to claim 10, wherein said at least one photoinitiator (iii) is selected from the group consisting of: 2-dimethylamino-2-(4-methyl-benzyl)-1-(4-morpholin-4-yl-phenyl)-butan-1-one, 2-Benzyl-2-(dimethylamino)-4'-morpholinobutyrophenone, 2-Methyl-4'-(methylthio)-2-morpholinopropiophenone, 1-Hydroxy-cyclohexyl-phenylketone, 2-Hydroxy-2-methylpropiophenone, 2,2-Dimethoxy-2-phenylacetophenone, lithium phenyl-2,4,6-trimethylbenzoylphospinate, and a combination thereof.

12. Photoresist formulation according to claim 10, further comprising:
(iv) at least one solvent which does not interact with the other components (i)-(iii) of the formulation, this solvent being selected from the group consisting of: cyrene, dimethylformamide, dimethylsulfoxide, pentadecane, hexadecane, heptadecane, octadecane, and a combination thereof.

13. Photoresist formulation according to claim 10, comprising said cyclic ketene acetal monomers (i) in a concentration of between 20 and 90 wt % relative to the total weight of the formulation.

14. Photoresist formulation according to claim 10, comprising said vinyl and/or (meth)acrylic monomers (ii) in a concentration of between 5 to 50 wt % relative to the total weight of the formulation.

15. Photoresist formulation according to claim 10, comprising said at least one photoinitiator (iii) in a concentration of between 1 and 15 wt % relative to the total weight of the formulation.

16. Photoresist formulation according to claim 12, comprising said at least one solvent (iv) in a concentration of between 1 and 30% by weight relative to the total weight of the formulation.

17. The process according to claim 2, wherein said process is a direct laser writing process or 3D microlithography.

18. The process according to claim 8, wherein said photoresist formulation comprises said at least one photoinitiator (iii) in a concentration of 3 to 5 wt % relative to the total weight of the formulation.

19. Process according to claim 9, wherein said photoresist formulation comprises said at least one solvent (iv) in a concentration of between 4 and 25% by weight relative to the total weight of the formulation.

\* \* \* \* \*